United States Patent [19]

Adams, Jr. et al.

[11] Patent Number: 5,185,215

[45] Date of Patent: * Feb. 9, 1993

[54] ZIRCONIA TOUGHENING OF GLASS-CERAMIC MATERIALS

[75] Inventors: Richard W. Adams, Jr., Marlboro, Mass.; David R. Clarke, Katonah, N.Y.; Sarah H. Knickerbocker, Hopewell Junction, N.Y.; Linda L. Rapp, Poughkeepsie, N.Y.; Bernard Schwartz, Hartsdale, N.Y.

[73] Assignee: International Business Machines Corporation, Armonk, N.Y.

[*] Notice: The portion of the term of this patent subsequent to Sep. 3, 2008 has been disclaimed.

[21] Appl. No.: 626,370

[22] Filed: Feb. 26, 1991

Related U.S. Application Data

[63] Continuation of Ser. No. 348,980, May 9, 1989, Pat. No. 5,045,402, which is a continuation-in-part of Ser. No. 146,455, Jan. 21, 1988, abandoned, which is a continuation of Ser. No. 892,687, Aug. 1, 1986, abandoned.

[51] Int. Cl.$^5$ .................. C04B 10/00; C04B 14/00
[52] U.S. Cl. ......................... 428/545; 501/5; 501/32; 501/9; 501/103
[58] Field of Search ............... 501/104, 105, 119, 153, 501/128, 2, 4, 5, 6, 7, 8, 9, 17, 18, 32; 428/631, 632, 633, 674, 614, 545, 472; 437/218

[56] References Cited

U.S. PATENT DOCUMENTS

| | | | |
|---|---|---|---|
| 4,587,224 | 5/1986 | Keefer et al. | 501/5 X |
| 4,624,934 | 11/1986 | Kokuba et al. | 501/32 X |
| 4,687,749 | 8/1987 | Beall | 501/9 X |
| 4,960,733 | 10/1990 | Kazuga et al. | 501/8 X |

Primary Examiner—Karl Group
Attorney, Agent, or Firm—Daniel P. Morris

[57] ABSTRACT

A ceramic material suitable for packaging of large scale integrated circuit is produced by the process of forming a mixture of a powdered glass ceramic material which is a glassy precursor to cordierite ceramic material, formed by the steps which are as follows:

a. Mix tetragonal phase material selected from the group consisting of zirconia or hafnia powder containing a stabilizing oxide compound selected from the group consisting of MgO, CaO and $Y_2O_3$ and a glass frit powder or frit of a glassy precursor of cordierite glass ceramic to yield a suspension of solids. Preferably, a binder is included.

b. Disperse the suspended solids to yield a dispersion of the zirconia or hafnia with the stabilizing oxide compound and the glassy precursor.

c. Densify the dispersion of zirconia or hafnia with the stabilizing oxide compound and the glassy precursor by a sintering heat treatment at a temperature of about 840° C. to melt the glassy precursor into a viscous fluid at a temperature below the melting point of the zirconia or hafnia powder particles to yield a densfied intermediate material with the zirconia or hafnia particles encapsulated in the molden glassy precursor.

d. Crystallize the densified intermediate material into a polycrystalline composite by heating at 900° C. to 950° C.

The process yields a ceramic material consisting of the tetragonal phase material encapsulated in crystalline cordierite glass ceramic material.

14 Claims, 5 Drawing Sheets

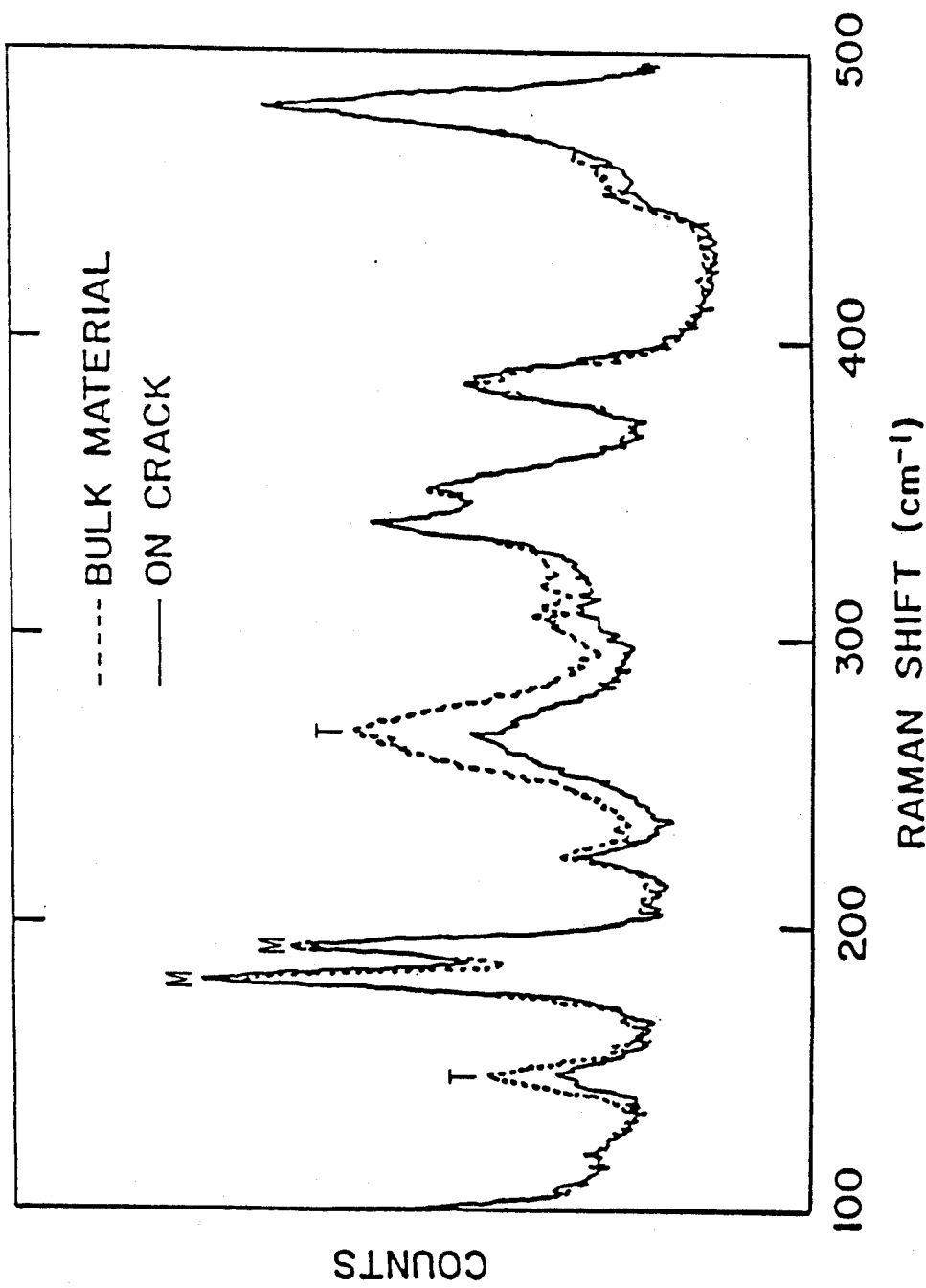

ZIRCONIA TOUGHENING OF GLASS-CERAMIC MATERIALS

This invention is a continuation of application Ser. No. 07/348,980 filed May 9, 1989, now U.S. Pat. No. 5,045,402, which is a continuation in part of application Ser. No. 07/146,455 filed on Jan. 21, 1988, now abandoned, which is a continuation of Ser. No. 06.892,687 filed Aug. 1, 1986, now abandoned.

BACKGROUND OF THE INVENTION

1. Field of the Invention

The present invention relates to ceramic packages and ceramic packaging materials for large scale integrated electronic circuits, and more particularly to a composition of such ceramic packaging materials adapted to increasing the toughness (resistance to fracture) of such ceramic materials.

2. Description of Related Art

Zirconia particles toughen a ceramic by either impeding the motion of a propagating crack, or absorbing or dissipating its energy. H. Ruf and A. G. Evans, "Toughening by Monoclinic Zirconia", *J. Amer. Cer. Soc.*, 66(55) 328-332 (1983) and N. Claussen and M. Ruhle, "Design of Transformation-Toughened Ceramics", *Advances in Ceramics, Amer. Cer. Soc.*, (3) 137 (1981). The former includes crack bowing and deflection effects. The latter, termed transformation toughening, results from a stress induced martensitic transformation of the zirconia from its tetragonal crystal structure to its monoclinic crystal structure. This transformation is accompanied by a 4% volume increase and a shear strain up to a maximum of 6%. The attainable toughening is dependent upon the volume fraction of transformable tetragonal phase, size and distribution of the zirconia particles, the elastic constraining properties of the matrix and the size of the transformed zone around the crack. Claussen et al. supra; F. F. Lange, "Transformation Toughening", *J. Mater. Sci.*, (17), 235-239 (1982); and A. G. Evans and A. H. Heuer, "Transformation Toughening in Ceramics: Martensitic Transformation in Crack Tip Stress Fields", *J. Amer. Cer. Soc.*, 63 (5-6) 241-248 (1980), and R. McMeeking and A. G. Evans, "Mechanics of Transformation Toughening In Brittle Materials", *J. Amer. Cer. Soc.*, 65(5) 242-245 (1982).

Zirconia toughening has been demonstrated in a variety of crystalline ceramic materials in the last decade. The earliest example, dating back over ten years, was in a two-phase zirconia ceramic consisting of tetragonal zirconia in a matrix of cubic zirconia. This material, described by R. Garvie, R. H. Hannink and R. T. Pascoe, "Ceramic Steel?", Nature, 258(12) 703-704 (1975) was produced by a precipitation heat treatment. Since this original work, a number of workers have demonstrated that the fracture resistance of many crystalline ceramic materials can be increased by incorporating in them particles of tetragonal zirconia, which transform to the monoclinic form when the material is fractured.

Claussen et al. showed that the incorporation of zirconia into an alumina body increased its fracture toughness. Claussen et al. prepared their materials by the usual methods of ceramic forming in which powders of alumina and zirconia were mixed together and then fired to sufficiently high temperatures that the material sintered (densified) to form a monolithic body.

U.S. Pat. No. 4,316,964 of Lange et al. for "$Al_2O_3$/$ZrO_2$" describes a zirconia toughened alumina ceramic prepared by using submicron powders of $Al_2O_3ZrO_2$. "The composite powders were ball-milled with methanol and alumina balls in a plastic container and then dried. Densification was achieved by hot-pressing the powders for 2 hours at a temperature selected to obtain small grain size and therefore favor the retention of tetragonal $ZrO_2$." The pressing temperatures in TABLE 1 were from 1400° to 1600° C. At Col. 5, line 18-it is stated, "The average grain size of the end member compositions which were hot-pressed at 1400° C. was about 2 $\mu$m for the $Al_2O_3$ and 0.5 $\mu$m for the $ZrO_2$." The ceramic is not a glass ceramic and the pressing temperatures employed are excessive from the point of view of the packaging of integrated circuits.

Stevens and Evans, "Transformation Toughening by Dispersed Polycrystalline Zirconia", *Br. Ceram. Trans. J.* Vol. 83, 28-31 (1984) describes transformation toughening of alumina ceramics by volume expansion when tetragonal zirconia transforms to the monoclinic form. It states at page 28, "The phenomenon of transformation toughened ceramics relies on the volume expansion, 3-5% and shear strain ~7% developed when tetragonal zirconia transforms to the monoclinic form. Toughening of a ceramic host material is attained by retention of the tetragonal zirconia in a metastable state, the phase change to the monoclinic form being initiated by the tensile stress field of an advancing crack. Within a fixed distance of the crack tip, determined by the elastic stress field in its vicinity, any metastable tetragonal zirconia will transform and, as a result of the volume expansion and accommodating shear strains, exerts a back stress on the crack . . . ."

U.S. Pat. No. 4,358,516 of Lange, for "Sodium Ion Conductor, Solid Electrolyte Strengthening with Zirconia", describes how the incorporation of transformable tetragonal zirconia could be used to increase the resistance to fracture of a sodium ion conductor solid electrolyte ceramic, $\beta$-alumina. For example, the addition of solid grains of metastable tetragonal $ZrO_2$ with "a grain size less than about 2 $\mu$m and has dissolved it in a rare earth oxide such as $Y_2O_3$ . . . " (See abstract). The materials are added to the alumina to provide improved fracture toughness.

As in U.S. Pat. No. 4,316,964 Lange, one can use additions of rare earth oxides, such as yttria, to control the formation of zirconia that is stable in the finished material in its tetragonal form.

For example, the addition of 15 vol. % zirconia to $\beta''$-$Al_2O_3$ increases the fracture toughness, $K_c$, from 3.0 to 3.8 MPam$^{\frac{1}{2}}$ and the strength from 147 to 414 MPa. See Stevens et al. supra. Alumina with 7.5 vol. % zirconia shows an increase in $K_c$ from 4.5 to 7 MPam$^{\frac{1}{2}}$, and adding 17.5 vol. % zirconia to spinel increased the strenght from 200 to 500 MPa. (See Claussen et al. supra.)

Originally used to toughen zirconia ceramics and alumina, the use of transformation toughening has rapidly been accepted as a way of increasing the fracture resistance (toughness) of all sorts of ceramics including oxides, nitrides and carbides. In all these materials, marked increases in toughening have been achieved when the processing conditions have enabled the tetragonal form of zirconia to be retained in the microstructure. However, there is one class of materials in which, despite the incorporation of tetragonal zirconia, true transformation toughening has not been reported, namely glasses and glass-ceramics.

Previous workers, who have attempted to toughen glasses and glass-ceramics by the use of zirconia, have done so by precipitating the zirconia from the glass phase. This is the manner in which zirconia, one of the traditional nucleating aids in the manufacture of glass-ceramics, is known to be formed in its tetragonal form.

For instance, U.S. Pat. No. 4,396,682 of Mohri et al. for "Glazed Ceramic Substrate" describes a ceramic print head with 50-60 wt. % of $SiO_2$, 10-30 wt. % of CaO and MgO, and 2-6 wt. % of $ZrO_2$ plus optional materials including the addition of one of BaO, ZnO, PbO, $P_2O_5$, $B_2O_3$, $Na_2O$ and $K_2O$. The resulting material is a glass which has excellent high temperature stability for use in thermal print heads. The process used involves the heating in air to 1400° C., which is far above an acceptable level of heating for air process since it would be far above the melting point of the metallization. At Col. 3, lines 6-21 it is explained that the $ZrO_2$ raises the transition point of the glass composition above 2 wt % of $ZrO_2$ in the material. Above 6 wt % the $ZrO_2$ becomes an obstacle to the surface smoothness of the material. No mention is made of the tetragonal phase of the zirconia. In view of the temperature of 1400° C. to which the material is heated in the Example, the zirconia is in a solid solution in the glass. Moreover, no mention is made therein of particles of zirconia in the glass.

See also U.S. Pat. No. 4,353,047 where zirconia is added as a nucleating agent.

U.S. Pat. No. 4,234,367 of Herron, Master and Tummala for "Method of Making Multilayered Glass Ceramic Structures Having an Internal Distribution of Copper-based Conductors" describes use of cordierite glass in conjunction with a thermoplastic binder in laminated green sheets. The glass comprises MgO, $Al_2O_3$, $SiO_2$, $B_2O_3$, $SnO_2$, $Al_2O_3$, $P_2O_5$ and $ZrO_2$ glass particles in a glass ceramic. The laminate of green sheets is heated to a burnout temperature of 720° to 785° C. Then the laminate is later heated to a crystallization temperature of about 920° to 970° C. Here the composition of the glass particles is quite different from those employed here in view of the presence of $P_2O_5$, $B_2O_3$ and in some cases $SnO_2$ and the absence of a stabilizing compound such as yttria plus the absence of teachings of particle size limitations claimed herein.

U.S. Pat. No. 4,301,324 of Kumar, McMillan and Tummala for "Glass-Ceramic Structures of Gold, Silver or Copper" describes β-spodumene glass ceramic and cordierite glass ceramic materials. In connection with the cordierite glass. There is no CaO or $Y_2O_3$ stabilizing material, but there is CaO with respect to the β-spodumene at Col. 7, lines 61 and 62 and in Table I, Col. 4. The cordierite glass does contain from 0 to 2.5 wt % of $ZrO_2$ in Table I. Glass No. 11 in Table III includes $B_2O_3$ plus $ZrO_2$ but also includes "$P_2O_5$ and is sintered at 925° C. Glass No. 12 in Table III includes, $B_2O_3$ but also includes $P_2O_5$ and is sintered at 950° C. There is no suggestion of using yttria as a stabilizing agent. There is also no mention of the tetragonal zirconia phase in connection with Glasses No. 11 and 12. The cordierite is of the μ form for glass No. 11 and of the α form for glass No. 12. See Col. 9, lines 17 to 45. It is stated that the ceramic has greater strength than other ceramics. It is stated that it was thought that the enhanced strength was attributable to inclusion of $ZrO_2$, Col. 9, lines 25 to 28. There is no discussion of the particle sizes of the zirconia. A key distinction of the result of the process of the instant invention from the process Kumar et al. is that the zirconia is in a solid solution in the glass ceramic. We find that there is no encapsulation of particles of zirconia in the tetragonal phase in the Kumar et al. product.

The objective of this invention is to provide a glass which is transformation toughened through the use of zirconia, which glass is crystallized to a cordierite ($2MgO.2Al_2O_3.5SiO_2$) glass-ceramic upon heat treatment. The method of manufacture, a "composite" route in which particles of the glass, having the desired glass-ceramic composition, and the zirconia are mixed together and fired as in a standard ceramic process. It avoids the conventional glass-ceramic manufacturing route which involves melting of the ingredients, and subsequent crystallization to produce the glass-ceramic body. Furthermore, the method enables the size of the tetragonal particles to be kept within a desirable range.

U.S. Pat. No. 4,421,861 of Claussen for "High-Strength and Temperature-Change Resistant Ceramic Formed Body, Especially of Mullite, its Production and Use" describes a zirconia toughened cordierite ceramic made by a reaction process, which involves deriving zirconia from a salt of zirconium. To obtain zirconia in that way the material is sintered at unacceptably high temperatures of from 1300° C., to 1600° C., preferably. Such a high temperature is far higher than an acceptable temperature for formation of VLSI packaging products since it is so high that the copper metallization of the circuits on the package would be destroyed by the heat. In short, the copper would turn to useless puddles on the package. Thus the Claussen et al. process is a very significantly different process from ours. It also produces a much different result.

Ruh et al. "Phase Relations in the System $ZrO_2$-$Y_2O$ sub 3 Contents", *Communications of American Ceramic Society*, C-190 to C-192, (Sep., 1984), describes use of yttria with zirconia to lower the monoclinic-tetragonal transformation temperature of zirconia, but it does not suggest the use of such material with cordierite.

B. Schwartz "Making High Strength Ceramics", *IBM Technical Disclosure Bulletin*, Vol. 11, No. 7, 848 (Dec. 1968), describes placing the surfaces of a ceramic material in compression relative to the central portions of the article by altering the composition of the outer layers of at least three layers of green ceramic material slightly prior to firing, by adding chromium to alumina. The ceramic materials are used as substrates for microelectronic devices. Obviously this disclosure does not contemplate use of zirconia or the equivalent as the material which provides hardening. In addition it does not suggest the temperature range that is taught here.

In D. J. Green and M. G. Metcalf, "Properties of Slip-Coat Transformation-Toughened β"-$Al_2O_3$/$ZrO_2$ Composites", *Ceramic Bulletin*, Vol. 63, No. 6 pp. 803–807, and 820 (1984), it is stated at page 805 first full paragraph that "The majority particles are less than 1 μm for both powders but there are some particles as large as 20 μm".

Porter, D. L., Evans, A. G., & Heuer, A. H. *Acta Metal*, Vol. 27, p. 1649 (1979) describes toughening of β" Alumina and of Zirconia, respectively. None of the prior art suggests the range of sizes of particles of zirconia of hafnia. The temperature range used in forming the hardened ceramic materials is suggested by none of the prior art for forming ceramic, but merely to the formation of ceramics and the Herron et al. U.S. Pat.

No. 4,234,367 does not relate to hardening of ceramics, per se.

A number of test methods have been used to measure the fracture toughness of ceramics, and the effect of zirconia additions. One of these is the indentation test method, which is described in detail by Antis et al., "A Critical Evaluation of Indentation Techniques For Measuring Fracture Toughness: I. Direct Crack Measurements", *Journal of the American Ceramic Society*, 64(9) 533-538, (1981). In this method, a diamond pyramid is pressed, with a known load, into the surface of a material until cracks propagate from the corners of the indentation impression. The length of the cracks so formed for a given load are a measure of the resistance of the material to fracturing (its so-called fracture toughness).

The transformation of zirconia from its tetragonal form to its monoclinic form as a result of the passage of a crack (the basis of transformation toughening) has been shown to lead to an increase in fracture toughness by Garvie et al., "Ceramic Steel?", *Nature*, (258), pp. 703-704 (1975) and by Clarke and Adar, "Measurement Of The Crystallographically Transformed Zone Produced By Fracture In Ceramics Containing Tetragonal Zirconia", *Journal Of The American Ceramic Society* 65(6) pp. 284-288 (1982). Garvie et al. measured their materials before and after fracturing by techniques of X-ray diffraction, to show that some of the tetragonal zirconia had transformed to monoclinic zirconia. Clarke and Adar used Raman spectroscopy to show that some of zirconia particles around cracks had transformed from the original tetragonal form to the monoclinic form.

The degree of transformation of zirconia from the tetragonal form to the monoclinic form dictates the attainable toughening. Thus, if only 25% of the tetragonal zirconia in a body is transformed to monoclinic zirconai, the fracture toughness will not exceed 25% of the theoretically possible. Likewise, a material made in such a way that part of the zirconia is already in its monoclinic form, there will be less zirconia available in its tetragonal form for transformation to monoclinic.

SUMMARY OF THE INVENTION

In its broadest aspect this invention is a fracture toughened glass ceramic, the method of fabrication thereof and a toughened glass ceramic substrate containing conducting patterns embedded therein.

There is a need to improve the strength of glass-ceramics. The material needs to be toughened in order to withstand handling in the electronic circuit manufacturing process.

An object of this invention is to provide a process of manufacturing ceramic materials suitable for packaging of electronic circuits at a temperature compatible with the metallization used to provide electrical circuit conductors. Producing a ceramic laminate with conductor patterns therein is well known in the art. U.S. Pat. No. 4,234,367 to Herron et al. and U.S. Pat. No. 4,504,339 to Kamehara et al., the teachings of which are incorporated herein by reference, are primarily directed to producing such a laminate. We have found it is critically important that the process be performed at a temperature below the melting or sintering temperature of the metallization, such as copper, formed on or within the ceramic material. The melting point of copper is about 1083° C. If the metallization is heated excessively, it melts, disperses, or acts as a flux to the glass or melts to form a puddle on the ceramic material. If the metallization is damaged, the electrical circuits in the integrated circuit structure are destroyed, thereby destroying the value of the package. Previous work in ceramics did not involve such metallization and accordingly process temperatures which were far too high have been employed. It is a prerequisite in the art of electronic circuit packaging that the ceramic materials be processed at lower temperatures compatible with preserving the metallization structures on the packages. Metals for use in packages include but is not limited to Ag, Au, Al and Cu.

Ceramic materials suitable for practicing the present invention include but are not limited to cordierite, spodumene, eucryptite, borosilicate glass, lead glass, enstatite, celsian, wollastonite, willemite, anorthite, lithium, disilicate, lithium metasilicate, mullite, combinations thereof and combinations thereof with alumina. This list is exemplary only and not limiting. U.S. Pat. Nos. 4,301,324 and 4,413,061 both to Kumar et al., the teachings of which is incorporated herein by reference, describe spodumene and cordierite compositions. The following is a list of the general formula for the predominant components of the materials mentioned above:

celsian, $BaO.Al_2O_3.2SiO_2$
anothite, $CaO.Al_2O_3, 2SiO_2$
lithium disilcate, $Li_2O_6.2SiO_2$
lithium metasilicate, $Li_2O.SiO_2$
wollastinite, $CaO.SiO_2$
willemite, $2ZnO.S_1O_2$
eucriptite, $Li_2O.Al_2O_3.2SiO_2$
mullite, $3Al_2O_3.2SiO_2$
enstatite, $MgO.SiO_2$ The term glass ceramic means an aggregate of randomly oriented crystallites, for example, the material listed above, wherein the intersticies between crystallites may contain uncrystallized material such as glass, for example the precursor of the above listed materials.

For convenience the invention will be described with reference to a cordierite glass ceramic which is the most preferred glass ceramic.

In accordance with this invention, a ceramic material suitable for electronic large scale integrated circuit packaging comprises a cordierite or other glass ceramic material mixed with particles consisting essentially of a powdered, tetragonal phase of a material selected from the group consisting of one or more of zirconia or hafnia powder containing a stabilizing oxide compound. The cordierite or other glass ceramic crystalline material encapsulates the particles and the stabilizing oxide compound. The stabilizing oxide compound is selected from the group consisting of MgO, CaO, $Y_2O_3$ and titania, and selected rare earth oxides. The stabilizing oxide compound comprises from 0.1 mole percent to 8 mole percent of said zirconia or hafnia. The stabilizing oxide compound plus said zirconia of hafnia comprises at least about 5 volume percent of the total volume percent of the ceramic material. The glass ceramic material comprises at least about 75 volume percent of the total volume of the ceramic material. The particles have a size within the range from about 0.5 to about 8.0 μm. A ceramic material in accordance with this invention, which is suitable for packaging , is produced by the process of forming a mixture of a powdered glass ceramic material which is a glassy precursor to cordierite or other ceramic materials, formed by the steps which are as follows:

a. Mix tetragonal phase material selected from the group consisting of zirconia or hafnia powder containing a stabilizing oxide compound selected from the group consisting of MgO, CaO and $Y_2O_3$ and a glass frit powder or frit of a glassy precursor of cordierite or other glass ceramics to yield a suspension of solids. Preferably, a binder is included.

b. Disperse the suspended solids to yield a dispersion of the zirconia or hafnia containing the stabilizing oxide compound and the glassy precursor.

c. Densify the dispersion of zirconia or hafnia containing the stabilizing oxide compound and the glassy precursor by a sintering heat treatment at a temperature above the glass transition temperature to melt the glassy precursor into a viscous fluid at a temperature below the melting point of the zirconia or hafnia powder particles to yield a densified intermediate material with the zirconia of hafnia particles encapsulated in the molten glassy precursor. The preferred temperature is about 840° C.

d. Crystallize the densified intermediate material into a polycrystaline composite by heating up to about 1100° C., preferably from about 840° C. to about 950° C., most preferably, from 900° C. to 950° C. The crystallization time decreases with the temperature being for a cordierite glass ceramic about 1 hour at 840° C. and about a minute at 950° C.

The process yields a ceramic material consisting of the tetragonal phase material encapsulated in crystalline cordierite or other glass ceramic materials.

A ceramic material suitable for packaging is produced by the process of forming a mixture of a powdered glass ceramic material which is a glassy precursor to the cordierite or other crystalline glass ceramic materials, formed by the steps which are as follows:

a. Mix zirconia or hafnia powder containing a stabilizing oxide compound selected from the group consisting of MgO, CaO and $Y_2O_3$ and a glass frit powder or frit of the glassy precursor yielding a suspension of solids. Preferably, prior to mixing, perform the step of milling of the zirconia or hafnia powder in a fluid in a ball mill for one hour to produce ball milled zirconia or hafnia powder. Preferably, the fluid used to facilitate mixing is methanol. Preferably, the step of ball mixing of the glassy precursor and the zirconia or hafnia mixture is performed for a time duration of on the order of from about two minutes to about 13 hours, preferably 13 hours. The mixture is preferably mixed during the dispersion step with an ultrasonic probe. Then it is preferable that the product of mixing with an ultrasonic probe be dried while stirring magnetically or the equivalent.

b. Disperse the suspended solids to yield a dispersion of the zirconia or hafnia with the and the glassy precursor.

c. Densify the dispersion of zirconia or hafnia and glassy precursor by heat treatment at a temperature of about 840° C. to yield a densified intermediate material.

d. Crystallize the densified intermediate material into a polycrystalline composite material by heating up to about 1100° preferably from about 840° C. to 950° C.

e. The process yields a ceramic material consisting of the tetragonal phase material encapsulated in crystalline cordierite or other glass ceramic materials.

BRIEF DESCRIPTION OF DRAWINGS

In FIG. 6, are presented Raman Spectra recorded using an optical probe of a material shown in TABLE III.

Figure 1:
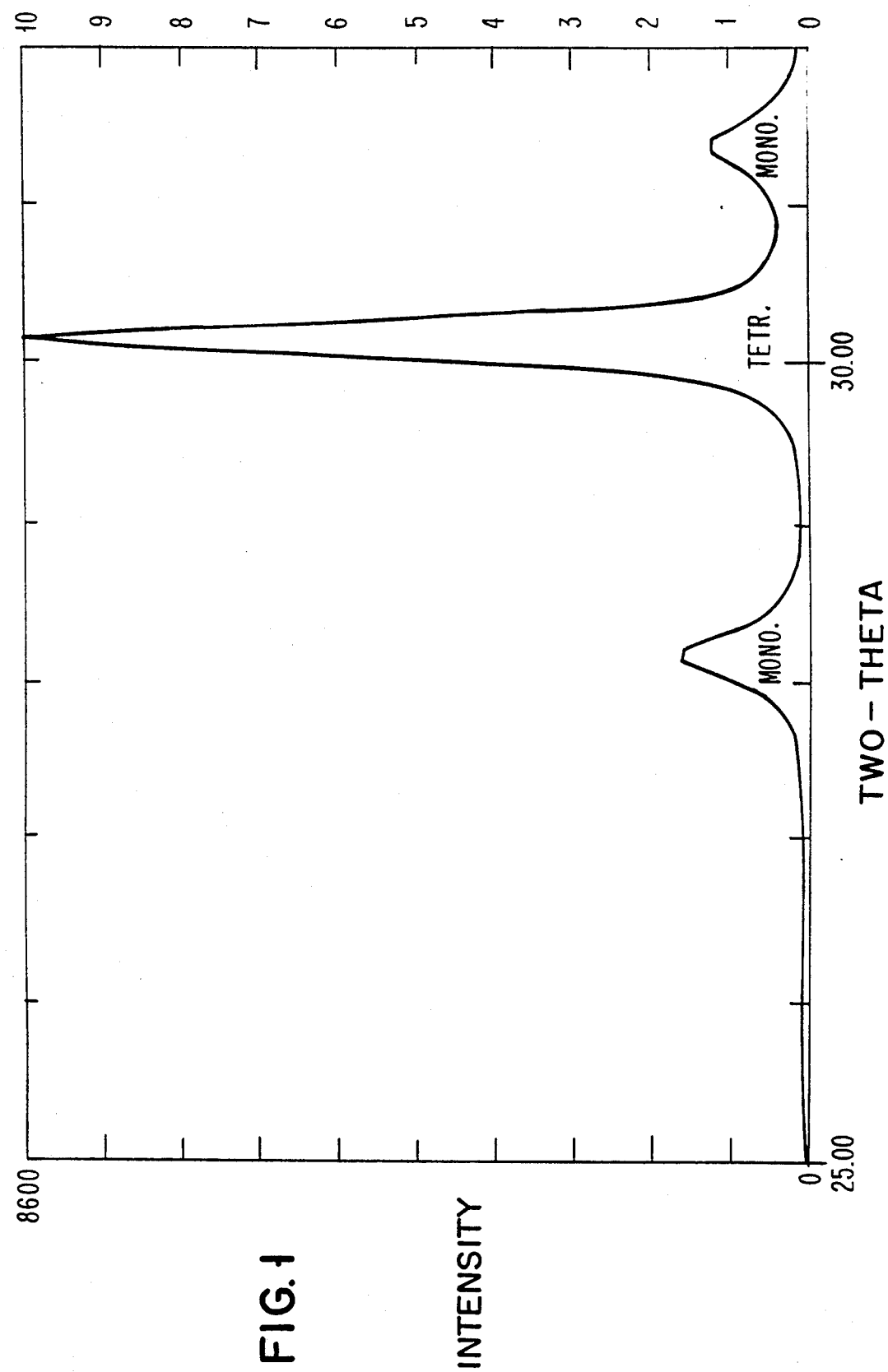
FIG. 1 shows the X-ray diffraction pattern of 2.2 mol % $Y_2O_3$-$ZrO_2$ as received from supplier.

The foregoing and other objects, features and advantages of the invention will be apparent from the more particular description of the preferred embodiments of the invention which follows.

DESCRIPTION OF THE PREFERRED EMBODIMENT

Disclosure of the Invention, Best Mode and Other Modes of Carrying Out the Invention Transformation toughening requires a well dispersed phase of metastable tetragonal zirconia, that upon fracturing will transform to the monoclinic form. Zirconia exists as three phases, monoclinic, tetragonal and cubic. Monoclinic is the stable form below 950° C. The monoclinic to tetragonal transformation occurs between 950° C. and 1200° C. The cubic phase is formed at 2370° C. as explained by R. Stevens, *Introduction to Zirconia*, Magnesium Elecktron Inc., Flemington, N.J. (1983). Tetragonal zirconia is retained at room temperature through the use of stabilizing oxide compounds such as MgO, CaO and $Y_2O_3$, control of the particle size and the elastic properties of the host matrix. (See Lange, supra and Stevens et al., supra). Adding the stabilizing oxide compounds magnesia (MgO), calcia (CaO) and yttria ($Y_2O_3$), reduces the tetragonal to monoclinic transformation temperature.

Zirconia or hafnia is added to the frit of a glass precursor of a cordierite glassceramic to toughen the fabricated glass ceramic. Zirconia or hafnia is added in the tetragonal phase. This phase is unstable at temperatures below about 950° C. The tetragonal phase transforms to the monoclinic form at temperatures above about 950° C. At temperatures below 950° C. crack formation in the ceramic initiates the transformation from tetragonal to monoclinic crystal structure. The transformation involves a volume expansion which causes the toughening. Toughening increases as the percentage of the tetragonal phase increases. When the ceramic material is used as a microelectronic packaging substrate, the use temperature is generally less than about 200° C. If the transformation temperature is closer to the use temperature, a larger percentage of the zirconia or hafnia will be in the tetragonal phase since it is more stable with a lower transformation temperature. The transformation temperature is lowered by adding to the zirconia or hafnia a stabilizing oxide material. A molecule of the stabilizing oxide takes the place of a zirconia or hafnia molecule at a lattice site of the tetragonal crystal structure. This substitution results in lowering the transformation temperature. To achieve effective stabilization, a fraction of the total lattice sites must be replaced by stabilizing oxide molecules. As used herein, stabilizing refers to lowering the tetragonal to monoclinic zirconia transformation temperature. This is achieved by adding stabilizing oxides to the tetragonal zirconia.

We have found that the yttria stabilized zirconia, employed in accordance with this invention, forms the transformable tetragonal phase in the compositional range of 0-5 mol %. Decreasing the particle size also increases the stability of the tetragonal phase. The maximum particle size at which pure zirconia will remain tetragonal is generally less than 1 μm, whereas for a 2 mol. % $Y_2O_3$ stabilized zirconia it is larger. The volume constraining effects of the matrix also increases the stability of the constraining effects of the matrix also increases the stability of the tetragonal form, increasing the critical diameter. (See Lange, supra). Pure zirconia particles less than 0.5 μm in diameter remain tetragonal while constrained in an alumina matrix. The critical diameter in a matrix increases with the use of the partially stabilized zirconias of MgO, CaO and $Y_2O_3$.

Dispersion of zirconia powder in the host matrix is an important processing step of this invention. Agglomerates of zirconia particles contribute flaws to a fired microstructure. Techniques for dispersion included mechanically mixing the powders, attrition of zirconia grinding media, and sol-gel techniques. (Claussen et al., supra). Aside from mechanical mixing, the other processing techniques are expensive and difficult to control. For these reasons, in one aspect of this invention, the mechanical mixing approach is employed in accordance with this invention.

Examples of compositions of glass ceramic materials toughened according to the present invention, suitable for electronic large scale integrated circuit packaging, are shown in TABLE I.

TABLE I

| | WEIGHT PERCENT | | | |
|---|---|---|---|---|
| | CORDIERITE + 3% ENSTATITE | BETA-SPODU-MENE | WILLE-MITE | ANOR-THITE |
| $Al_2O_3$ | 21.23 | 14.42 | 14.0 | 14.42 |
| MgO | 20.00 | — | — | — |
| $SiO_2$ | 55.00 | 71.5 | 31.0 | 55.0 |
| $P_2O_5$ | 2.77 | 2.08 | — | 2.08 |
| $B_2O_3$ | 1.00 | — | 10.0 | — |
| $LiO_2$ | — | 10.0 | — | — |
| $K_2O$ | — | 2.0 | 45.0 | — |
| ZnO | — | — | — | — |
| CaO | — | — | — | 23.0 |
| $ZrO_2$ | — | — | — | 2.5 |

The most preferred glass ceramic contains a cordicrite glass ceramic, of the formula ($2MgO-2Al_2O_3-5SiO_2$) encapsulating particles of zirconia, hafnia or some combination of the two such as an alloy thereof. These particles increase in size when they transform from their initial crystal structure to a structure which requires more volume. This increase in volume produces forces which increase the fracture toughness of the material.

We have discovered that it is essential that the zirconia or hafnia particles have a size within the range from about 0.5 μm to about 8.0 μm and preferably about 3.0 μm. It is critically important to the invention, that the particles are so small. When materials are made with significantly larger sizes than the range from about 0.5 μm to about 8.0 μm, no transformation toughening has been obtained during our experiments with the process of this invention.

In addition, we have found it is critically important that the process be performed at a temperature below the melting or sintering temperature of the metallization such as copper formed on, i.e. on or within, the ceramic material. If the copper is heated excessively, it melts, disperses, or acts as a flux to the glass or melts to form a puddle on the ceramic material. If the copper is damaged, the electrical circuits in the integrated circuit structure are destroyed, thereby destroying the value of the package.

In this invention the known additive of a stabilizing oxide compound material, such as yttria, magnesia, calcia, titanium dioxide and oxides of rare earths, is employed to reduce the tetragonal to monoclinic transformation temperature so that the tetragonal state will be maintained at room temperature. Yttria is sometimes included within the class of rare earth oxides. However, yttria has atomic number 39, whereas the lathamide rare earth elements have atomic number 58 to 71 and the actinide rare earth elements have atomic number 90 to 101.

EXAMPLES

Five zirconia powders have been employed. One was a pure unstabilized zirconia with a mean particle diameter of 0.03 μm and a partially stabilized 2.5 mol. % yttria-zirconia with a mean size of 0.02 μm. The third, a 2.2 mol. % yttria-zirconia with a mean size of 25 μm was employed.

Two 3 mol. % MgO-zirconia powders were investigated, one of which was spray dried. These were prepared from the citrates.

X-ray diffraction studies revealed that the tetragonal content of the partially stabilized powders could be increased by calcining (heating a granular or particulate solid at a temperature sufficient to remove most of its chemically combined volatile matter) to 1180° C. Samples were prepared using both the original powders as received from the manufacturers and powders calcined, as above.

BALL-MILLING

Ball-milling was used to disperse the zirconia powders with the glass powder of the glass ceramic material shown in TABLE I, above.

For compatibility with current techniques for substrate manufacture, methanol, used in the green sheet binder system for MLC structures, is employed as the milling suspension. Methanol produced a superior dispersion of zirconia powders when compared with methyl iso-butyl ketone.

The zirconia powders were milled for one hour prior to adding the powder of the composition shown in TABLE I. Then they were milled an additional 13 hours.

After milling, the powders were further dispersed with a 300 watt ultrasonic probe operated at maximum power for two minutes.

EVAPORATION OF SOLVENT.

After the ultrasonic mixing step, the methanol solvent was evaporated from the samples while mixing with a magnetic stirrer to prevent preferential particle settling of the denser zirconia particles.

PRESSING

To reduce porosity to a minimum for accurate fracture toughness measurements, one gram green pellets were uniaxially pressed at 88 MPa (Megapascals, where 1 Megapascal=145 psi), without binder, and then isostatically pressed at 69 MPa.

AIR FIRING

All samples were subsequently air-fired at 960° C. for two hours.

The fracture toughness of the samples was measured using the indentation technique after the sample surfaces were ground and polished. See G. R. Anstis, P. Chantikul, B. R. Lawn and D. B. Marshall, "A Critical Evaluation of Indentation Techniques for Measuring Fracture Toughness: I, Direct Crack Measurements", *J. Amer. Cer. Soc.* 64(9) 533–538 (1981); B. H. Mussler and M. W. Shafer, "Preparation and Properties of Mullite-Cordierite Composites", *Bull. Amer. Ceram. Soc.*, 63 (5) 705–710 (1984).

X-ray diffraction revealed that the polished and as fired surfaces were equivalent in tetragonal phase content, assuring test validity. At least three indentations per sample were made with a Zwick (Zwick Company Old Saybrook, Conn.) hardness tester, configured with a Vickers diamond pyramidal indenter. Indentations were done at loads of 29.412 and 88.236N. The sonic resonance technique (Schreiber, Anderson and Soga, *Elastic Constants and Their Measurements*, McGraw-Hill, New York, p. 91 (1974)) was used to measure Young's modulus (required for fracture toughness calculations) for a bar of 10 vol % 2.5 mol % yttria-zirconia and the material of TABLE I, above, air fired to 960° C. This bar was made by the lamination at 31 MPa, of 15 layers of 0.29 mm cast green sheets. The green sheet slurry was prepared by using 130% of the binder system employed for casting the powder of TABLE I. Due to the high surface area of the 0.02 μm zirconia particles, more binder liquid was needed to lower the slurry viscosity in order to pour it from the ball mill. Dispersion was done in the binder system, first by milling the zirconia powder for one hour and then adding the powder of TABLE I and ball milling for an additional two hours. It should be noted that this method is not effective for complete dispersion and was used only for a Young's modulus specimen.

FIG. 1 shows the X-ray diffraction pattern of 2.2 mol % $Y_2O_3$-$ZrO_2$ as received from the supplier.

Figure 2:
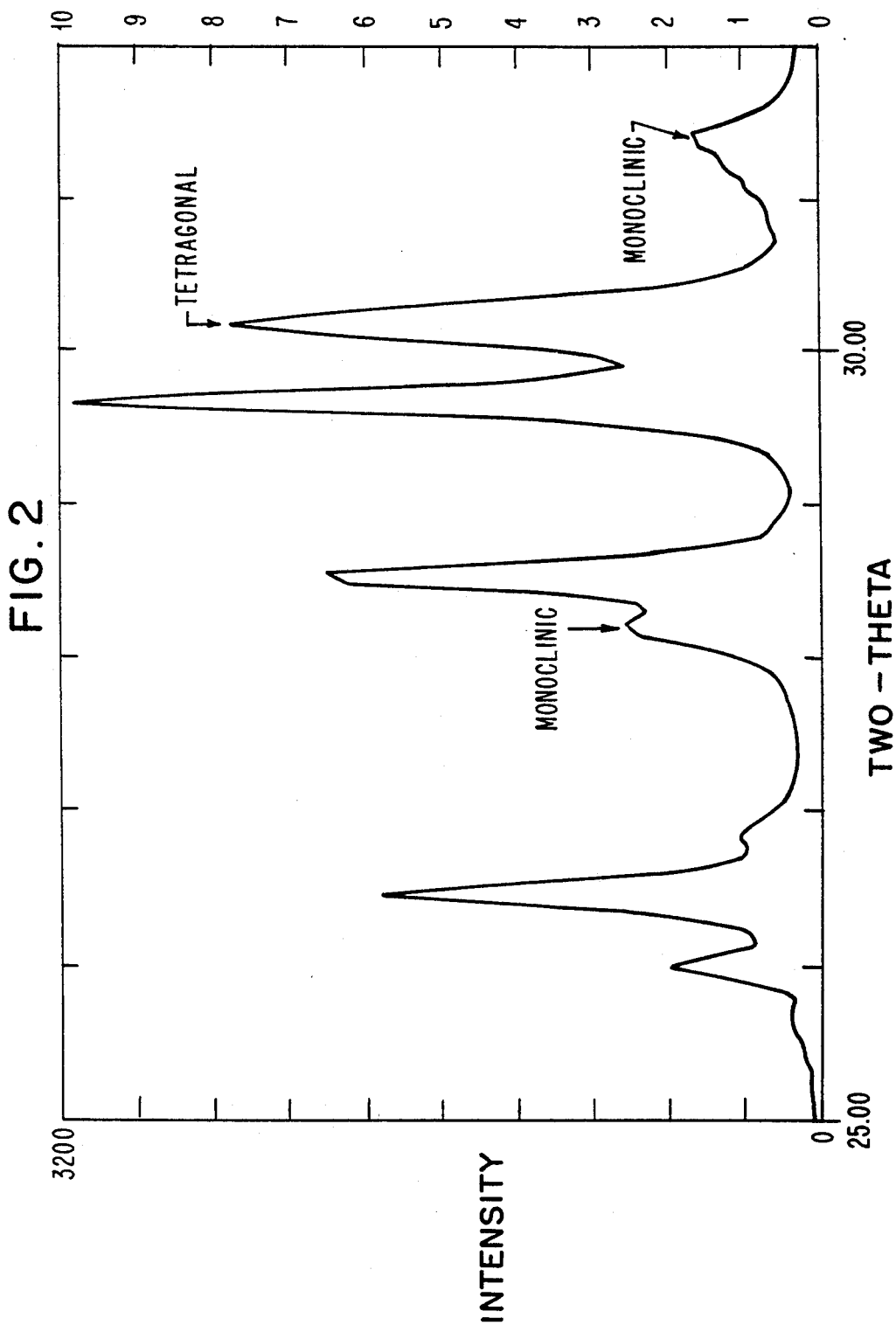
FIG. 2 shows the X-ray diffraction pattern of 10 vol % 2.5 mol % $Y_2O_3$-$ZrO_2$ incorporated into the cordierite glass ceramic of TABLE I.

FIG. 2 shows the X-ray diffraction pattern of 10 vol % 2.5 mol % $Y_2O_3$-$ZrO_2$ incorporated into the cordierite glass ceramic of TABLE I.

X-ray analysis of the powders showed that calcining the commercially manufactured, partially stabilized zirconia to 1180° C. could significantly increase the tetragonal phase content. The results, shown in TABLE II below indicate an increase from 50% to 95% tetragonal phase for the 2.5 mol % yttria-zirconia of sample 1 in TABLE II and from 73% to 85% for the 2.2 mol % yttria-zirconia of sample 9 in TABLE II below. The pure zirconia remained monoclinic.

TABLE II

| | X-RAY DIFFRACTION DATA VOL % TETRAGONAL | |
|---|---|---|
| SAMPLE | POWDERS | FIRED PELLETS |
| 1) MgO—$ZrO_2$ (Sp. dried) | 74% | 10% |
| 2) -Calc. 1180° C. | -0- | NM* |
| 3) MgO—$ZrO_2$ (Sp. dried) | 42% | -0- |
| 4) -Calc. 1180° C. | -0- | NM* |
| 5) Pure $ZrO_2$ | -0- | -0- |
| 6) -Calc. 1180° C. | -0- | NM* |
| 7) 2.5 mol % $Y_2O_3$—$ZrO_2$ | 50 | 58 |
| 8) -Calc. 1180° C. | 95 | 66 |
| 9) 2.2 mol % $Y_2O_3$—$ZrO_2$ | 73 | 58 |
| 10) -Calc. 1180° C. | 85 | NM* |

*NM = Not Measured

Chemically prepared 3 mol % magnesia-zirconia showed a reversal in tetragonal content, becoming completely monoclinic upon calcination. The spray dried powder did show the highest tetragonal content, 74%, of the as-received powders. The magnesia-zirconia system does decompose at 1200° C. An analysis of a sample of this zirconia dispersed in the glass-ceramic and fired to only 960° C. shows that the tetragonal content is very low compared to other specimens containing partially stabilized zirconia (TABLE II). It is possible that various cationic impurities are present in these citrated derived powders that lend stability to the tetragonal phase. Upon firing, these impurities are evolved, decreasing the stability of the tetragonal phase. If the stabilizing oxide compounds along with the impurities could be controlled such that the tetragonal phase begins to lose stability at 960° C., one could incorporate a highly metastable tetragonal zirconia in the glass-ceramic matrix. One would have a zirconia powder that remains highly tetragonal during processing at room temperature, but becomes highly metastable upon heat treatment to 960° C., maximizing transformation toughening.

The zirconia powders partially transform upon processing. A precalcined powder that was 95% tetragonal changed to 74% tetragonal after attritor milling for 30 minutes. The formation of the green pellets by pressing, did not lead to transformation of the zirconia particles.

The fired samples of the commercially manufactured zirconias incorporated in the glass-ceramic do show considerable tetragonal content in an X-ray diffraction pattern, FIG. 2. The tetragonal content calculated for these samples are rough estimates and should not be directly compared with data obtained for zirconia powders.

Additional test firing the zirconia mixed with the glass of TABLE I revealed that no zircon ($ZrSiO_4$) was formed upon firing the zirconia mixed with the glass of TABLE I even up to temperatures of 1180° C., holding the temperature there for one hour.

Young's modulus for a composite of 10 vol % 2.5 mol % yttria-zirconia in the material of TABLE I, air fired to 960° C., as determined by sonic resonance was 137 GPa. This compares with a Young's modulus of 130 GPa for the material of TABLE I alone. The 137 GPa value coincides with the calculation of Young's modulus from equations for two phase systems. Young's modulus for 15% added zirconia was not measured, but calculated as 141 GPa.

Figure 3:
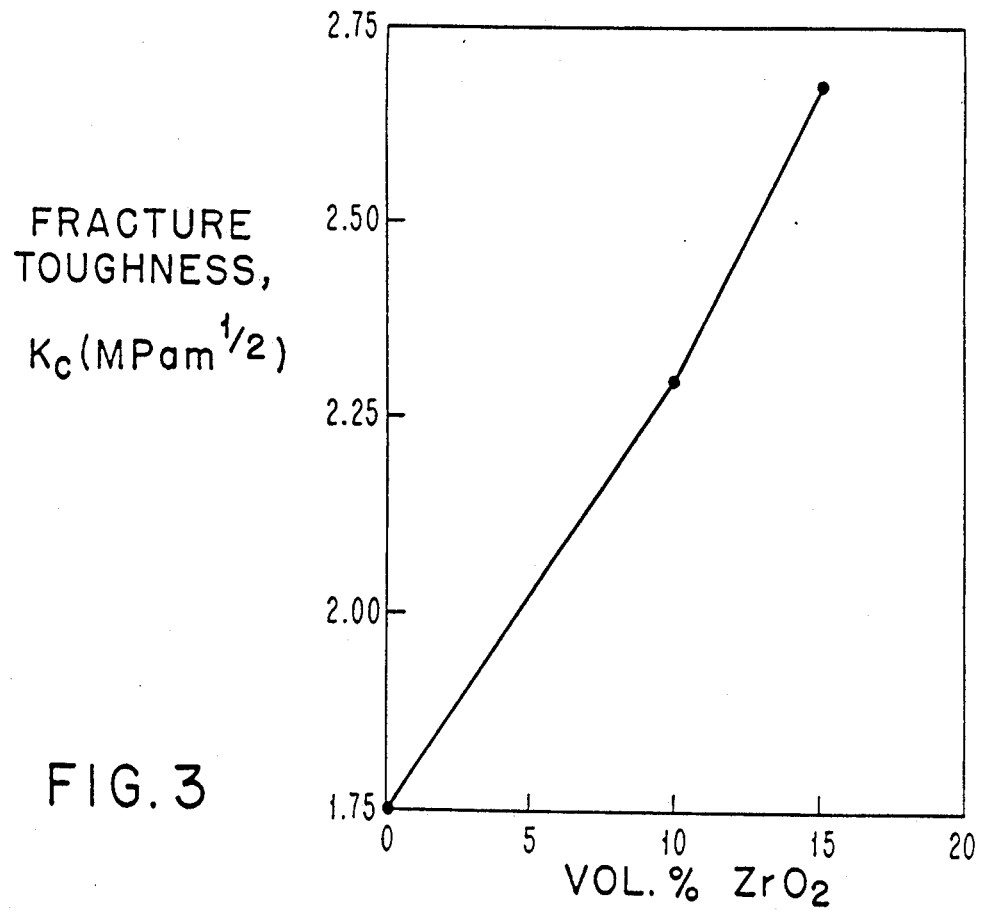
FIG. 3 shows the Fracture Toughness $K_c$ vs Vol % $ZrO_2$ indicating the variation of fracture toughness with the addition of pre-calcined 2.2 mol % $Y_2O_3$-$ZrO_2$.
Figure 4:
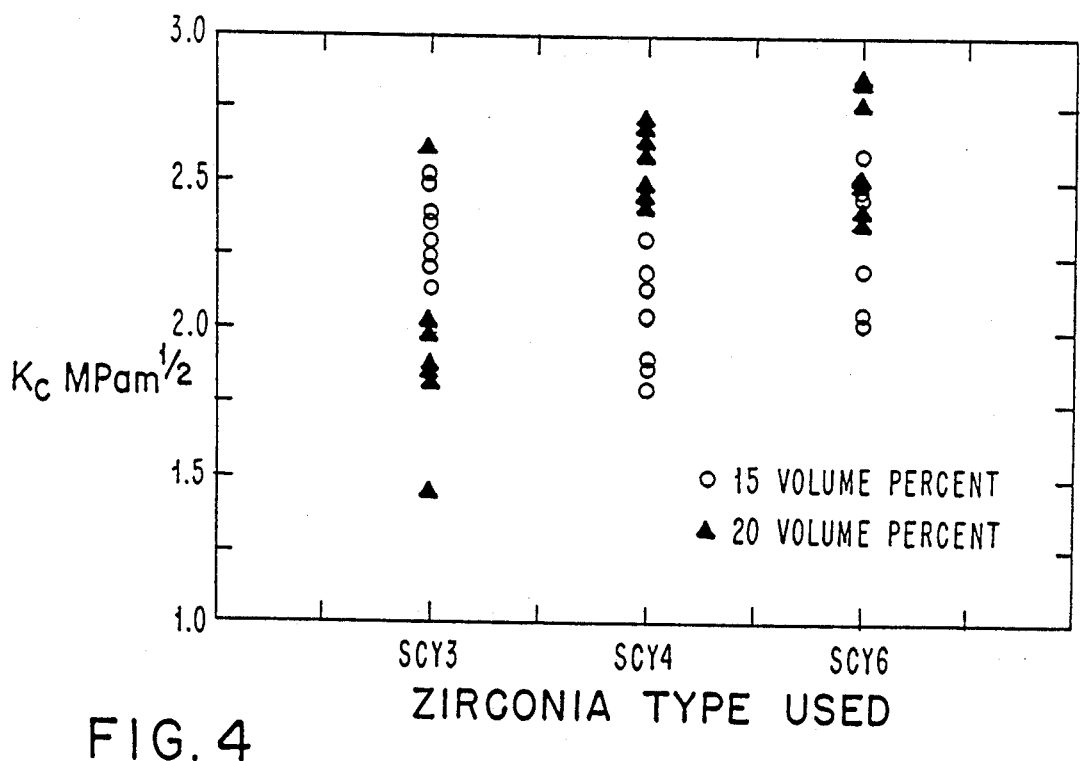
FIG. 4 is a graph of the fracture toughness of the glass-ceramic for different values of yttria additions and for different volume additions of zirconia.

The results of fracture toughness measurements are given in both TABLE III and in the graph of FIG. 3. FIG. 3 shows the Fracture Toughness $K_c$ vs Vol % $ZrO_2$ indicating the variation of fracture toughness with the addition of precalcined 2.2 mol % $Y_2O_3$-$ZrO_2$. The maximum error in these measurements is 0,1 MPam⅟. The values for fracture toughness, $K_c$, were all measured at the same load, of 88.236N (9 Kg). The graph of FIG. 4 plots the fracture toughness of the glass-ceramic for different values of yttria additions and for different volume additions of zirconia. It plots $K_c$ in MPam⅟ vs the Zirconia type used for 15 and 20 percent zirconia with 3, 4 and 5 percent yttria. The variation in measured values of fracture toughness exhibited by the data of FIG. 4 was attributed to variations in dispersion of the zirconia particles and local densification resulting from the presence of agglomerates. The variation thus emphasizes the necessity of good dispersion of the zirconia particles during the material preparation. The increase in fracture toughness of the materials containing zirconia, could be shown to be due to transformation toughening by examining the materials after fracturing.

In FIG. 6, are presented Raman Spectra recorded using an optical probe of a material shown in TABLE III. The Raman Spectra were recorded from a region remote an indentation crack (top) and from an indentation crack (bottom). The lower ration of the tetragonal to monoclinic peaks in the bottom spectrum indicates that a fraction of the tetragonal zirconia grains have been transformed by the fracturing process.

TABLE III

FRACTURE TOUGHNESS DATA

| SAMPLE | $K_c$(MOam⅟) ± 0.1 Max | % CHANGE |
|---|---|---|
| 1) TABLE 1 COMPOSITION | 1.75 | — |
| 2) 10 vol. % Pure $ZrO_2$ | 2.00 | +16 |
| 3) 10 vol. % 2.5 mol % $Y_2O_3$—$ZrO_2$ | 2.15 | +23 |
| 4) -same-precalcined $ZrO_2$ | 2.15 | +23 |
| 5) 10 vol. % 2.5 mol % $Y_2O_3$—$ZrO_2$ | 2.43 | +39 |
| 6) -same-precalcined $ZrO_2$ | 2.30 | +30 |
| 7) 15 vol % 2.2 mol % $Y_2O_3$—$ZrO_2$ | — | — |
| 8) -same-precalcined $ZrO_2$ | 2.68 | +53 |
| 9) Beta-spodumene composition of TABLE I 15 Vol % $ZrO_2$ stabilized with $Y_2O_3$ | 1.5 | +20 |

Figure 5:
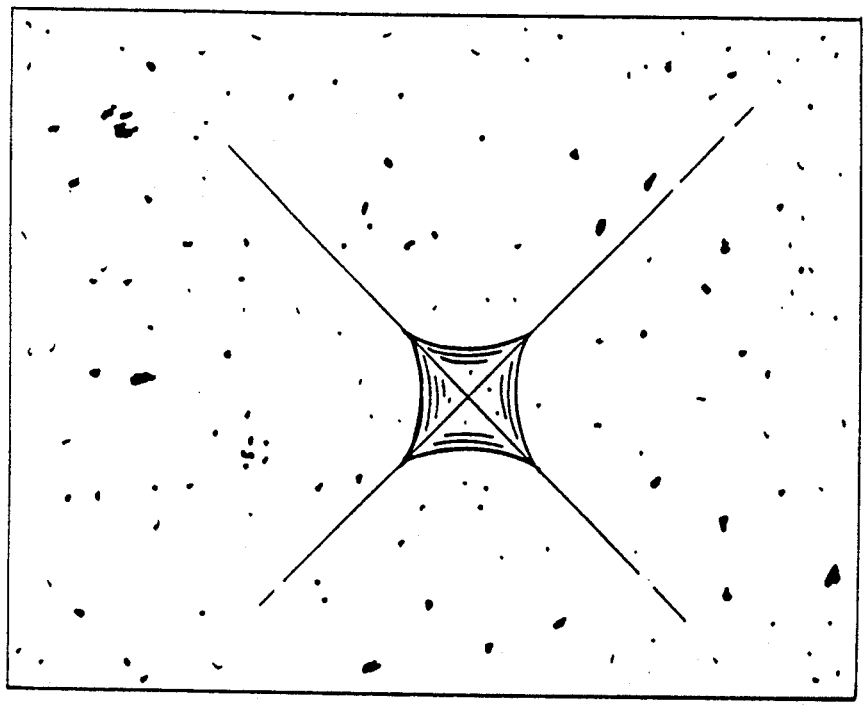
FIG. 5 is a sketch based upon a photograph of a Vickers indentation from a 88.236N load in a TABLE I composition of cordierite glass-ceramic containing 10 vol % 2.5 mol % $Y_2O_3$-$ZrO_2$.

FIG. 5 is a sketch made from a photograph of a Vickers indentation from a 88.236N load in a TABLE I composition of cordierite glass-ceramic containing 10 vol % 2.5 mol % $Y_2O_3$-$ZrO_2$.

It is important that the zirconia particles be uniformly distributed throughout the matrix. This powder did result in the highest value for fracture toughness, and should contribute the fewest flaws to the fired microstructure.

Adding 10 vol % of the 2.5 mol % yttria-zirconia to the glass-ceramic increased its dielectric constant from 5.0 to 5.8. The value of 5.8 compares with a calculated value of 5.5. The coefficient of thermal expansion increased from $1.8 \times 10^{-6}$/° C. for the glass-ceramic alone to $2.5 \times 10^{-6}$/° C. at 25° C. to 300° C.

CONCLUSIONS

1. Adding a second phase of zirconia particles to the glass-ceramic of TABLE I reduces its brittleness and increases its fracture toughness.
2. Dispersion is very important to the densification and thus the strength of this two phase system. The larger particles size, 25 μm powder disperses very well during comminution and mixing in the ball mill and showed the highest fired density of the zirconia plus glass-ceramic mixtures. This powder also resulted in the highest values for fracture toughness: adding 10 vol % increased $K_c$ by 30% to 40%, and adding 15 vol % increased $K_c$ by more than 50%.
3. The 0.02 μm and 0.03 μm powders were too fine to obtain a good dispersion using this process.

ALTERNATIVE DESIGNS

In one alternative design, the zirconia or hafnia particles are found localized in a specific region, for example, only in the outer layer of the material to provide compressive forces there to form an outer compressive layer to resist crack propagation due to the transformation of the zirconia and/or hafnia material to the monoclinic phase from the tetragonal phase, if possible. The incorporation of the zirconia only a localized region such as in the outer layer of the ceramic has the advantage of maintaining a low overall dielectric constant for the ceramic material. That is in spite of the fact that the dielectric constant of the zirconia and/or hafnia.

The ceramic material is produced by the process of forming a mixture of a powdered glass ceramic material (which is a glassy precursor of cordierite crystalline ceramic material), formed by the steps which are as follows:

1. Mix a powdered, tetragonal phase of a material selected from the group consisting of one or more of zirconia or hafnia powder containing a stabilizing oxide compound selected from the group consisting of MgO, CaO, $Y_2O_3$, titania, and selected rare earth oxides, and a glass frit powder or frit of a glassy precursor of a crystalline ceramic material, for example, cordierite, spodumene, eucriptite, borosilicate glass, lead glass, enstatite, celsian, wollastinite, willemite, anorthite, lithium disilicate, lithium metasilicate, mullite, combinations thereof and combinations thereof with alumina, most preferably of a cordierite containing composition yielding a suspension of solids.
2. Disperse the suspended solids to yield a dispersion of the zirconia or hafnia and the glassy precursor.
3. Densify the dispersion of zirconia or hafnia and glassy precursor by a sintering heat treatment at a temperature of about 840° C. to melt the glassy precursor composition into a viscous material at a temperature below the melting point of the zirconia or hafnia powder particles to yield a densified intermidediate material with the zirconia or hafnia particles encapsulated in the molten glassy precursor.
4. Crystallize the densified intermediate material by heating at 840° C. to 950° C.

A process is provided for making the new ceramic material suitable for packaging. It is produced by the process of forming a mixture of a powdered glass ceramic material which is a glassy precursor to the matrix material of the ceramic matrix, formed by the steps which are as follows:

1. Mix a powdered, tetragonal phase of a material selected from the group consisting of one or more of zirconia or hafnia powder, a stabilizing oxide compound selected from the group consisting of MgO, CaO, $Y_2O_3$, titania and selected rare earth oxides, and a glass frit powder or frit of a glassy precursor of a crystalline ceramic material most preferably of cordierite composition yielding a suspension of solids. The stabilizing oxide compound comprises from 0.1 mole percent to 8 mole percent of the zirconia or hafnia.
2. Disperse the suspended solids to yield a dispersion of the zirconia or hafnia containing a stabilizing oxide compound, and the cordierite.

3. Densify the dispersion of zirconia or hafnia and cordierite or other glass ceramics by heat treatment at a temperature of about 840° C. to yield a densified intermediate material.

4. Crystallize the densified intermediate material into a polycrystalline composite by heating at 900° C. to 950° C.

In one version of this invention, prior to the step of mixing, one mills the zirconia or hafnia powder in a fluid in a ball mill for one hour to produce ball milled zirconia or hafnia powder. The fluid used to facilitate mixing is methanol. Preferably, the step of ball mixing of the glassy precursor and zirconia or hafnia mixture lasts on the order of 13 hours, and the mixture is mixed during the dispersion step with an ultrasonic probe. Then one dries the product while stirring magnetically or the equivalent.

INDUSTRIAL APPLICABILITY

This invention is applicable in data processing such as personal computers, minicomputers, large scale computers and other data processing equipment. In addition, this system and process will be applicable to industrial and consumer electronic devices employing LSI chips. Electronic products such as transportation and control systems incorporating data processing systems for continuous monitoring and like functions can use the packaging methods and systems of this invention.

While the invention has been illustrated and described with respect to preferred embodiments, it is to be understood that the invention is not limited to the precise constructions herein disclosed, and the right is reserved to all changes and modifications coming within the scope of the invention as defined in the appended claims.

Having thus described our invention, what we claim as new, and desire to secure by Letter Patent is:

1. An article comprising:
   a ceramic body;
   said ceramic body comprises about 75 volume percent of a dielectric material which is an aggregate of randomly oriented crystallite having intersticies therebetween optionally containing uncrystalized material and the remainder being substantially a material selected from the group consisting of $ZrO_2$, $HfO_2$ and a mixture thereof in the form of particles having a size between about 0.5 to about 8.0 microns, said particles having a tetragonal crystalline structure and being sufficiently dispersed within said ceramic body to increase the toughness of said ceramic body;
   said particles further containing an oxide compound selected from the group consisting of MgO, CaO, $Y_2O_3$, $TiO_2$ and rare earth oxides, there being at least enough of said oxide to increase the amount of said tetragonal structure of said material of said particles; and
   an electrical conductor pattern within said ceramic body said conductor pattern having a melting temperature greater than the crystallization temperature of said dielectric material.

2. The article of claim 1, wherein said conductor pattern contains copper.

3. The article of claim 1, wherein said dielectric material is at least a part of a surface of said ceramic body.

4. The articles of claim 1, wherein said dielectric material is a cordierite glass ceramic.

5. The article of claim 1, wherein said particles include from about 0.1 to 8.0 mole percent of said oxide compound.

6. The articles of claim 1, wherein said conductor pattern has a melting temperature less than about 1100° C.

7. The article of claim 1, wherein said dielectric material is selected from the group consisting of cordierite, spodumene, eucryptite, enstatite, celsain, wollastonite, willemite, anorthite, lithium disilicate, lithium metasilicate, mullite and combinations thereof.

8. The article of claim 1, wherein said crystallization temperature is a specific temperature less than about 1100° C. and wherein said melting temperature of said conductor pattern is greater than said specific temperature.

9. The article of claim 8, wherein said crystallization temperature is less than about 1100° C.

10. The article of claim 7, wherein said conductor pattern contains copper.

11. The article of claim 10, wherein said crystallization temperature is less than about 1100° C.

12. The article of claim 1, wherein said dielectric material contains borosilicate glass and a material selected from the group consisting of cordierite, spodumene, eucryptite, alumina, enstatite, celsian, wollastonite, willemite, anorthite, lithium disilicate, lithium metasilicate, mullite and combinations thereof.

13. An article comprising:
   a ceramic body;
   said ceramic body comprises at least about 75 volume percent of a dielectric material which is an aggregate of randomly oriented crystallite having interstices therebetween optionally containing uncrystallized material and the remainder being substantially a material selected from the group consisting of $ZrO_2$, $HfO_2$ and a mixture thereof in the form of particles having a size between about 0.5 to about 8.0 microns, said particles having a tetragonal crystalline structure and being sufficiently dispersed within said ceramic body to increase the toughness of said ceramic body;
   said particles further containing an oxide compound selected from the group consisting of MgO, CaO, $Y_2O_3$, $TiO_2$ and rare earth oxides there being at least enough of said oxide to increase the amount of said tetragonal structure of said material of said particles;
   an electrical conductor pattern within said ceramic body said conductor pattern having a melting temperature greater than the crystallization temperature of said dielectric material; and said dielectric material contains alumina and a material selected from the group consisting of cordierite, spodumene, eucryptite, enstatic, celsian, wollastonite, willemite, anorthite, lithium disilicate, lithium metasilicate, mullite and combinations thereof.

14. An article comprising:
   a ceramic body;
   said ceramic body comprises at least about 75 volume percent of a dielectric material which is an aggregate of randomly oriented crystallite having interstices therebetween optionally containing uncrystallized material and the remainder being substantially a material selected from the group consisting of $ZrO_2$, $HfO_2$ and a mixture thereof in the form of particles having a size between about 0.5 to about 8.0 microns, said particles having a tetragonal crystalline structure and being sufficiently dispersed within said ceramic body to increase the toughness of said ceramic body;

said particles further containing an oxide compound selected from the group consisting of MgO, CaO, $Y_2O_3$ $TiO_2$ and rare earth oxides there being at least enough of said oxide to increase the amount of said tetragonal structure of said material of said material;

an electrical conductor pattern within said ceramic body said conductor pattern having a melting temperature greater than the crystallization temperature of said dielectric material; and wherein said dielectric material contains lead glass and a material selected from the group consisting of cordierite, spodumene, eucryptite, alumina, ensatic, celsian, wollastonite, willemite, anorthite, lithium disilicate, lithium metasilicate, mullite and combinations thereof.

* * * * *